Nov. 8, 1966 J. M. SMITH ETAL 3,284,675

SEMICONDUCTOR DEVICE INCLUDING CONTACT AND HOUSING STRUCTURES

Filed April 5, 1961

INVENTORS:
TAGE P. SYLVAN,
JAMES M. SMITH,

BY Julius J. Zaskalicky
THEIR ATTORNEY.

United States Patent Office 3,284,675
Patented Nov. 8, 1966

3,284,675
SEMICONDUCTOR DEVICE INCLUDING CONTACT AND HOUSING STRUCTURES

James M. Smith and Tage P. Sylvan, Liverpool, N.Y., assignors to General Electric Company, a corporation of New York Filed Apr. 5, 1961, Ser. No. 100,933
8 Claims. (Cl. 317—234)

The present invention relates generally to semiconductor devices and, more particularly, to methods for forming and fabricating the active members thereof and to mounting structures thereof.

The present invention has particular application to semiconductor diode devices, in particular tunnel diode type devices. Such devices are conventionally formed of a wafer-type semiconductor material which is mounted on a conductive platform of a header. A tunnel junction is formed therein by alloying a ball of suitable alloy material into the wafer. A separate conductive connection is then made by means such as ultrasonic bonding between the alloyed region and one or a plurality of conductive leads of the header. Such structures leave something to be desired with regard to device characteristics, such as ruggedness, reliability, ease and cost of fabrication, as well as electrical performance and adaptability to a wide variety of applications.

The present invention is directed to overcoming the shortcomings of such prior art devices.

An object of the present invention is to provide a mounting structure for the fragile semiconductor bodies of semiconductor devices to enable such bodies to withstand great vibrational and shock stresses, yet which is simple in construction and to which the semiconductor elements are easily and cheaply assembled.

Another object of the present invention is to provide such a mounting structure which has highly advantageous electrical characteristics such as low inductance and capacitance, making it suitable for a wide variety of low and high frequency applications, as well as small size and coaxial in design, physically lending itself to such variety of uses.

A still other object of the present invention is to provide a simple, effective and low cost method for forming semiconductor junctions of small size as well as to form such junctions which are mechanically strong.

A further object of the present invention is to provide a mounting structure having good heat dissipation properties.

A still further object of the present invention is to provide improvements in mounting structures for semiconductive bodies of bar-shaped geometry as well as in the method of mounting such bodies.

The present invention is carried out in one illustrative form thereof in a semiconductor device comprising a bar-shaped body of semiconductor material by the provision of a planar insulating member having a conductive area on one surface thereof and a conductive lead extending axially therethrough in spaced relationship to the conductive area with the bar of semiconductor material having a side abutting and directly joined to the conductive area and an end portion directly abutting and joined to the lead.

The features of the invention which are believed to be novel are set forth with particularity in the appended claims. The invention itself, however, both as to its organization and method of operation together with further objects and advantages thereof, may best be understood by reference to the following description taken in accordance with the accompanying drawings in which:

Figure 1:
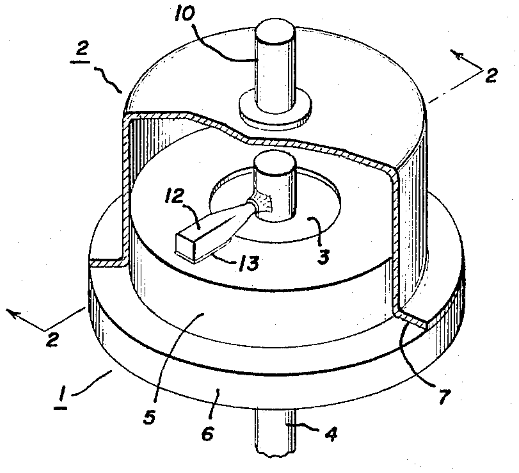
FIGURE 1 is a perspective view of a semiconductor device partly in section showing an embodiment of the mounting structure of the present invention.

Referring now to FIGURE 1, there is shown a device comprising a header member 1 and a cap member 2. The header member comprises an insulating base portion 3 conveniently of glass in which is embedded a conductive lead 4 axially extending therethrough and which is surrounded by a cylindrical conductive member 5 having a flange portion 6 adapted to engage with flange portion 7 of the cap 2. The conductive member is conveniently made of fernico containing by weight 54 percent iron, 29 percent nickel and 17 percent cobalt and having a coefficient of thermal expansion similar to the thermal coefficient of expansion of glass. As shown, particularly in FIGURE 2, the header member comprises planar surface 8 parallel to the inner planar surface 9 of the glass insulating member and is slightly elevated from it for reasons to be pointed out below. The cap member is provided with a lead 10 essentially coaxially aligned with the lead 4 and the header 1 to provide an essentially coaxial structure, as desired, lending itself to a variety of applications. The device shown in FIGURES 1 and 2 may be made of very small dimensions, for example, devices having a diameter of 0.10 inch and a height excluding leads of 0.09 inch having been conveniently made. In such devices, clearance between conductive surface portion 8 and the lead 4 was 0.01 inch.

A bar 12 of semiconductor material has side or a bottom portion abutting and soldered to the top planar conductive surface 8. The end portion of the bar is soldered to the lead 4 as shown. When incorporated in devices of the small dimensions such as mentioned above, the bar is also of small dimensions, for example, 0.008 inch by 0.008 inch by 0.020 inch.

Figure 2:
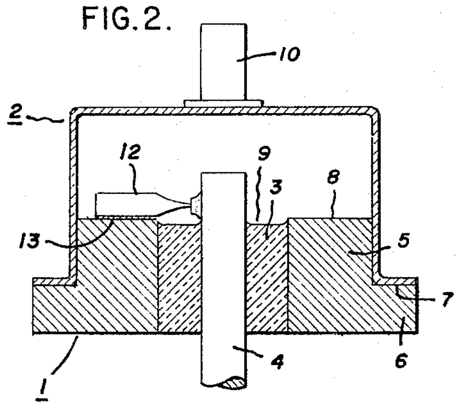
FIGURE 2 is a sectional view of the semiconductor device of FIGURE 1 taken along section 2—2.
Figure 4:
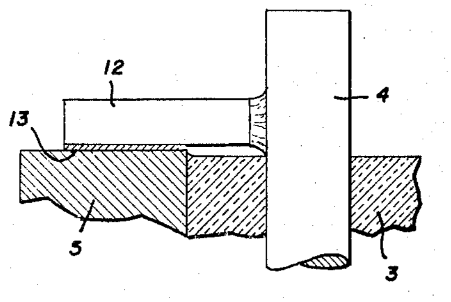
FIGURES 3 and 4 are enlargements of portions of the embodiments of FIGURES 1 and 2 showing steps in the formation of this embodiment.
Figure 3:
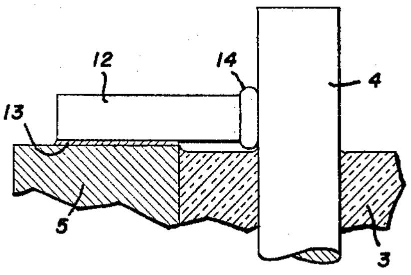

The manner of processing and fabricating the bar of semiconductor material into the completed device as shown in FIGURES 1 and 2 will be illustrated in connection with the fabrication of a tunnel diode device. The process steps of the invention will be more particularly illustrated in connection with FIGURES 2, 3, 4 and 5 of the drawings. A bar of semiconductor material of N-type conductivity 12 of appropriate resistivity, for example 0.0007 ohm centimeter and having the dimensions 0.008 inch by 0.008 inch by 0.020 inch is placed on the conductive surface 8, as shown in FIGURE 3. A solder preform 13 consisting of a small piece of foil, for example gold doped or activated with antimony (99 percent gold and 1 percent antimony by weight) is placed between the bar 12 and the surface 8. The bar, solder and surface are heated to cause a fusion of the bar to the surface. Next, a ball 14 of suitable alloying material, for example, gallium-doped indium (98½ percent indium, 1.5 percent gallium by weight), is placed between the end of the bar 12 adjacent the lead and the lead 4. The bar and ball is then again heated to cause the P-type conductivity inducing material 14 to alloy into the germanium, recrystallize and form a P-type conductivity region therein and at the same time make a connection of the P-type region to the lead, as more particularly shown in FIGURE 4. Heavy doping of the bar and the alloying material is used so that a tunnel junction is formed. The header is then electrolytically etched in an appropriate electrolyte such as sodium hydroxide to reduce the junction to sufficient size to produce the characteristics desired in a manner known in the art. The resultant structure is specifically illustrated in FIGURE 2. Of course, it is understood that all of the materials used in the making of the device are appropriately cleaned so that good adherence and a contamination-free resultant device is obtained.

Preferably, the bar 12 is of singly crystalline material and also of a preferred orientation to assure uniform wetting action of the P-type alloy and at the same time lending itself to being easily and consistently etched. It has been found that orienting the axis of the bar perpendicular to 1—1—1 crystallographic plane thereof achieves these highly desirable advantages. In view of the small mass and the small areas involved, the alloy time-temperature cycle used is considerably shortened over the cycles involving such alloying into flat wafer-type bodies. Also, in view of the small size, the time required for etching such bar-type bodies is considerably reduced. In addition, in view of the short time cycle used in a bar-type structure, fewer residual stresses are set up in the resultant structure. Concomitantly a saving in semiconductor material as well as etch solution per unit is obtained.

In the structure shown, a semiconductor element or member is mounted between two rigid members separated by a small distance, namely the header cylinder 5 and the lead 4, thus providing a good, strong mechanical structure for the semiconductor element which provides excellent resistance to shocks of all kinds. The coefficient of thermal expansion of the bar matches the thermal coefficient of expansion of the header members, thus providing immunity to thermal cycling. If desired, the element may be given further strength by potting in a suitable epoxy resin, for example, Hysol 2038 resin, available from Hysol Company of Olean, New York. While the device has been shown fabricated in two steps, namely first a joining to the header and thence the formation of the junction, it will be understood that the bar may be simultaneously secured to the header 5 and to the lead 4 at the same time. The heat may be applied as localized heat or it may be applied by the passing of current through the bar to fuse the metal alloy thereto.

Figure 5:
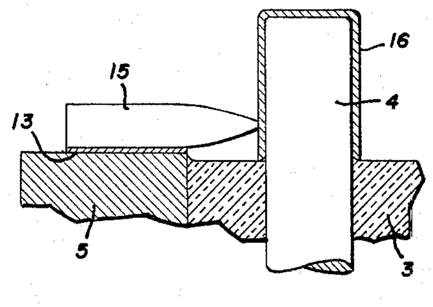
FIGURE 5 shows a variation in the embodiment of FIGURE 1 and particularly shows a variation in the process step for the formation thereof.

To further realize some of the advantages pointed out above, the semiconductor bar 15 may be suitable tapered as shown in FIGURE 5. The taper may be obtained by mechanical, electrolytic or chemical means and the alloying material may be applied as a sleeve 16 or as a plating on the lead 4. The bar is oriented in such a way that the tapered end makes contact with the sleeve. The process steps in the formation of the resultant device may be the same as pointed out above although with such an arrangement, electrical pulsing may be the preferred mode to form the junctions and connections. The preshaped bar permits P-type semiconductor materials to be used which does not etch preferentially. When normal structures are used with P-type material, the pellet often etches away before the junction etches to the desired area.

In the alternative, the entire header surface may be plated as well and the bar fused to the header and to the lead at the same time. The alloy material may be used for the ohmic as well as junction connection in such a case since the large area of contact to the header surface would function as an ohmic connection over the low current ranges over which the device would be used. Also, the bar alone may be suitably plated or dipped in a suitable alloy and placed in position and fused in a one-step operation.

It will be observed that the glass insulating member is suitably recessed to avoid shorting of the junction formed, as well as to facilitate the etching thereof.

It will be understood that while the device has been illustrated showing the formation of the junction on the header, the device may be applied to bars which have junctions preformed in them and may be secured to the header in the one-step soldering operation described above.

While the invention has been illustrated in connection with bar-type semiconductive members, it will be understood that ther physical forms may be used as well, such as wafer-type elements. While the invention has been shown applied to a tunnel diode type of device constituted of specific starting materials, such devices formed of other starting materials may, of course, be used, and likewise, the invention may be applied to other kinds of diodes and other semiconductor devices. For example, additional leads may be incorporated in the header, making the device suitable for use with transistors.

Thus, it is seen that applicants' have provided an extremely rugged semiconductor device which is made of a minimum of parts, which is easily assembled and yet which, in addition, provides great flexibility in usage in a wide variety of circuits, whether of the lumped or distributed parameter type. The device is low in inductance and capacitance, making it suitable for a wide variety of circuit applications.

While specific embodiments have been shown and described, it will, of course, be understood that various modifications may be devised by those skilled in the art which will embody the principles of the invention and found in the true spirit and scope thereof.

What we claim as new and desire to secure by Letters Patent of the United States is:

1. A semiconductor device comprising a planar insulating member having a conductive lead extending axially therethrough and a conductive area in one surface thereof in spaced relationship to said lead, a body of semiconductor material positioned on the said insulating member with a portion abutting and directly secured to said conductive area and extending across the insulating space toward said lead and another portion abutting and directly secured to said lead, and means for making electrical connections to said conductive area.

2. A semiconductor device comprising a planar insulating member having a conductive lead extending axially therethrough and a conductive area in one surface thereof in spaced relationship to said lead, a bar of semiconductor material extending across the space between said conductive area and said lead and having a side portion abutting and secured to said conductive area and another portion directly secured to said lead, and means for making electrical connection to said conductive area.

3. A semiconductor device comprising a planar insulating member having a conductive lead extending axially therethrough and a conductive area in one surface thereof in spaced relationship to said lead and elevated with respect to said insulating member, a bar of semiconductor material having a region of one type conductivity and a region of the opposite type conductivity type therein forming a P–N junction, said region of one conductivity type abutting and soldered to said conductive area and the end of said region of opposite conductivity type extending over the insulating space between said conductive area and said lead and being soldered to said lead, and means for making electrical connections to said conductive area.

4. A semiconductor device comprising a planar insulating member having a conductive lead extending axially therethrough and having a conductive area in one surface thereof in spaced relationship to said lead, a bar of semiconductor material of one conductivity type secured to said conductive area and extending across the space between said conductive area and said lead, an alloy of the opposite conductivity-inducing type fused to an end portion of said bar adjacent said lead to form a region of opposite conductivity type therein and fused to said lead to form a conductive contact therewith.

5. A semiconductor device comprising a planar insulating member having a conductive lead extending axially therethrough, a conductive area in one surface thereof in spaced relationship to said lead, a bar of semiconductor material of one conductivity type having a surface soldered to said conductive area and extending across the space between said conductive area and said lead, said bar being monocrystalline in structure and having the axis along its length perpendicular to the 111 crystallographic plane thereof, an alloy of the opposite conductivity-inducing type fused to an end portion of said bar to form a region of opposite conductivity type therein and fused to said lead to form a conductive contact therewith.

6. A semiconductor device comprising a planar insulating member having a conductive lead extending axially therethrough, a conductive area in one surface thereof in spaced relationship to said lead, a bar of semiconductor material of one conductivity type placed with a side portion abutting and soldered to said area and with an end portion tapered and extending across the space between said conductive area and said lead and adjacent to said lead, an alloy of the opposite conductivity-inducing type fused to an end portion of said bar to form a region of opposite conductivity type therein and fused to said lead to form a conductive contact therewith.

7. A semiconductor device comprising a planar insulating member having a lead extending axially therethrough and having a cylindrical member extending peripherially thereabout in coaxial relationship to said lead and a conductive portion on a surface of said member in spaced relationship to said lead, a bar of semiconductor material having one portion secured to said conductive area and the other portion thereof secured to said lead, a cup-shaped conductive member hermetically secured to said cylindrical portion and having a lead on that portion thereof remote from said cylinder in axial alignment with said aforementioned lead.

8. A semiconductor device comprising a planar insulating member having a lead extending axially therethrough and having a cylindrical member extending peripherially thereabout in coaxial relationship to said lead and a conductive portion on a surface of said member in spaced relationship to said lead, a bar of semiconductor material having one portion secured to said conductive area and extending across the space between said conductive portion and said lead and another portion thereof secured to said lead, a cup-shaped conductive member hermetically secured to said cylindrical portion and having a lead on that portion thereof remote from said cylinder in axial alignment with said aforementioned lead.

References Cited by the Examiner

UNITED STATES PATENTS

| | | | |
|---|---|---|---|
| 2,791,703 | 5/1957 | Pankove | 307—88.5 |
| 2,852,722 | 9/1958 | Noon | 317—234 |
| 2,963,632 | 12/1960 | Kilian et al. | 317—235 |
| 2,971,869 | 2/1961 | Taylor | 317—235 X |
| 2,990,501 | 6/1961 | Cornelison et al. | 317—234 |
| 3,020,454 | 2/1962 | Dixon | 317—234 |
| 3,128,530 | 4/1964 | Rouse et al. | 29—25.3 |
| 3,157,937 | 11/1964 | Billette et al. | 29—25.3 |
| 3,161,811 | 12/1964 | Brown | 317—234 |

FOREIGN PATENTS

| | | |
|---|---|---|
| 801,283 | 9/1958 | Great Britain. |
| 826,058 | 12/1959 | Great Britain. |

JOHN W. HUCKERT, *Primary Examiner.*

A. S. KATZ, J. W. KALLAM, R. SANDLER, *Assistant Examiners.*